Nov. 17, 1970 F. ROMANISIO ET AL 3,541,402

SEMICONDUCTOR DEVICE WITH MASSIVE ELECTRODES AND INSULATION HOUSING

Filed Dec. 6, 1968

INVENTORS
FRANCO ROMANISIO
CARLO FERRANDO

BY

Ostrolenk, Faber, Gerb & Soffen

ATTORNEYS

United States Patent Office 3,541,402

Patented Nov. 17, 1970

3,541,402

SEMICONDUCTOR DEVICE WITH MASSIVE ELECTRODES AND INSULATION HOUSING

Franco Romanisio, Pino Torinese, and Carlo Ferrando, Turin, Italy, assignors to International Rectifier Corporation, Los Angeles, Calif., a corporation of California Filed Dec. 6, 1968, Ser. No. 781,800
Claims priority, application Italy, Dec. 12, 1967, 19,973/67
Int. Cl. H01l 5/02
U.S. Cl. 317—234 6 Claims

ABSTRACT OF THE DISCLOSURE

A semiconductor diode having massive terminal electrodes which have flat parallel surfaces for pressure assembly in a circuit. Polygonal flanges at the opposing ends of the massive electrodes are surrounded by, and anchor an insulation ring.

This invention relates to semiconductor diodes, and more particularly relates to a terminal electrode structure and seal for a thin semiconductor wafer which permits improved heat transfer from the wafer and a relatively low manufacturing cost.

Low cost diodes which can be efficiently cooled, and which are reliably sealed against a harsh environment and which are mechanically rugged are desirable for many applications, such as for use in automotive alternators.

In accordance with the present invention, a diode is provided with massive and identical terminal electrodes connected to the opposing surfaces of a wafer. The electrodes have a polygonal flange at their adjacent ends which receive an insulation ring and which anchor the ring in an axial direction and against relative rotation with respect to the electrodes. The outer ends of each electrode then protrude axially beyond the insulation ring and terminate on flat, parallel end surfaces.

This construction uses a minimum number of inexpensive components and can be economically manufactured. The relatively massive electrodes (relative to the wafer size) are extremely efficient heat sinks, and may be held by pressure between support heat sinks on opposite sides of the diode, thereby insuring very efficient cooling of the diode. The sealing ring, which may be of any suitable insulation material such as an epoxy or polyester resin will rigidly clamp the electrodes together and will seal and protect the diode from mechanical damage. Note that the polygonal flanges of the electrodes will restrain rotation of the insulation ring with respect to the electrodes.

Accordingly, a primary object of this invention is to provide a semiconductor diode which is inexpensive, rugged and has efficient heat removal properties.

A further object of this invention is to provide a semiconductor diode which is useful for automotive applications.

Another object of this invention is to improve the bonding of an insulation ring to opposing electrodes of a semiconductor diode.

A still further object of this invention is to increase the power rating of a semiconductor device having a relatively small semiconductor wafer.

These and other objects of this invention will become apparent from the following description, taken in connection with the drawings, in which.

Referring to the figures, a thin circular semiconductor wafer 10 having a rectifying junction therein is positioned between the opposing flat faces of massive electrodes 11 and 12. Wafer 10 may be of monocrystalline silicon and the junction therein may be formed by any well-known process, such as a diffusion process. Electrodes 11 and 12 are identical and are formed of copper which may be suitably plated with layers of nickel and gold. The opposing surfaces of wafer 10 are connected to respective surfaces of electrodes 11 and 12 by soldering or in any other suitable manner.

Electrodes 11 and 12 have flanges consisting of circular bases 11A and 12A, respectively, which have upper octagonal surfaces 11B and 12B, respectively. The flanges of electrodes 11 and 12 receive a sealing ring 14 which encloses central regions of electrodes 11 and 12 and is axially and rotatably secured by the flanges and octagonal sections of electrodes 11 and 12. Sealing ring 14 may be of any suitable material such as an epoxy or polyester resin which can be cast or otherwise secured on the preassembled wafer 10 and electrodes 11 and 12. The outer ends of electrodes 11 and 12 extend beyond ring 14 and terminate with flat, parallel surfaces, suitable for connection in a circuit by pressure connection.

If desired, the diameter of wafer 10 may be less than the diameter of flange portions 11A and 12A to form an annular well surrounding wafer 10. This well is then filled with a suitable varnish or other sealing means to insure sealing and protection of wafer 10 before the application of insulation ring 14.

Figure 1:
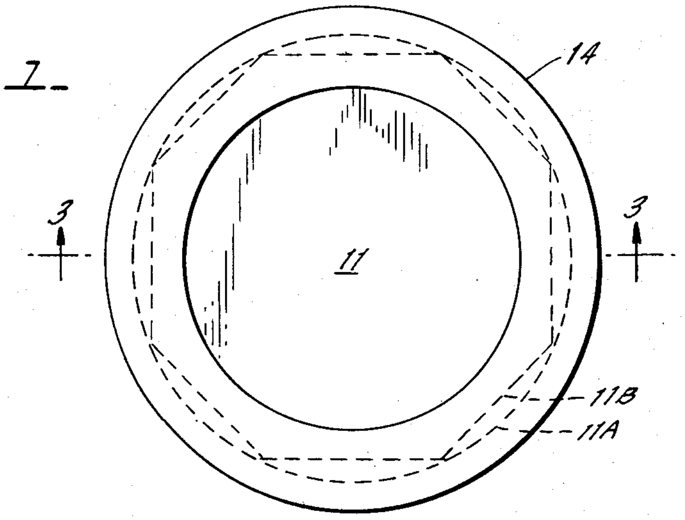
FIG. 1 is a top view of a diode constructed in accordance with the invention.
Figure 2:
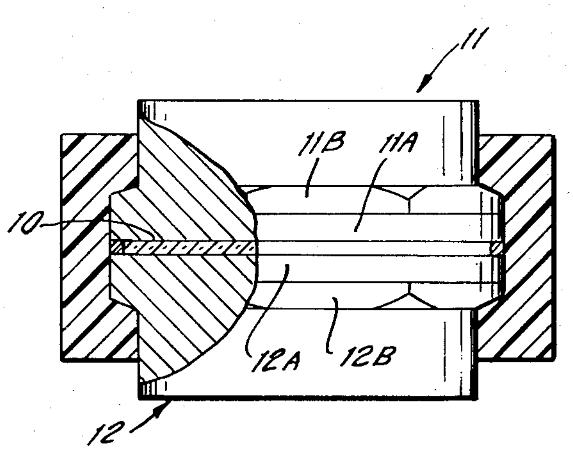
FIG. 2 is a side view, partly in section, of the diode of FIG. 1.
Figure 3:
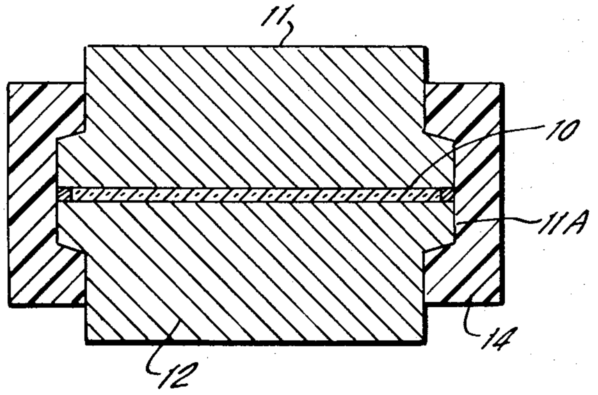
FIG. 3 is a cross-sectional view of FIG. 1 taken across section line 3—3 in FIG. 1.

The diode of FIGS. 1 to 3 is obviously simple in construction and lends itself to inexpensive manufacture. Electrodes 11 and 12 may be brazed or connected by pressure to heat sink supports which connect the diode in its circuit. Thus, the diode will dissipate heat uniformly and efficiently from both surfaces of wafer 10 through the relatively massive electrodes 11 and 12. This enables a reduction in size of a diode for a given power dissipation. For example, a diode rated at 20 amperes D-C at a given voltage can be reduced in weight from about 10 grams for a traditionally constructed device to about 1.5 grams when built in accordance with the invention.

Although this invention has been described with respect to particular embodiments, it should be understood that many variations and modifications will now be obvious to those skilled in the art, and, therefore, the scope of this invention is limited not by the specific disclosure herein, but only by the appended claims.

We claim:

1. A semiconductor diode comprising, in combination; a thin flat semiconductor wafer having first and second flat, parallel opposing surfaces, first and second substantially identical electrodes each having flat, parallel, end surfaces and each having an enlarged flange at one end thereof, and an insulation ring; said end surfaces of said first and second electrodes adjacent their said enlarged flange being connected respectively to said first and second surfaces of said wafer; said insulation ring extending axially across said enlarged flanges of said first and second electrodes and contacting the outer surfaces of said enlarged flanges; the opposite end surfaces of said first and second electrodes extending axially beyond the ends of said insulation ring.

2. The semiconductor device of claim 1 wherein at least one of said electrodes has locking means connected to said insulation ring for preventing rotation of said ring with respect to said one of said electrodes.

3. The semiconductor diode of claim 1 wherein said flange of at least one of said first and second electrodes has a polygonal configuration.

4. The semiconductor device of claim 1 wherein said first and second electrodes are soldered to said wafer.

5. The semiconductor diode of claim 3 wherein said flange of said at least one of said first and second electrodes has a circular outer periphery and wherein said polygonal configuration is formed on the shoulder above said circular outer periphery.

6. The semiconductor device of claim 3 wherein said polygonal configuration is an octagon.

References Cited

UNITED STATES PATENTS

| | | | |
|---|---|---|---|
| 3,176,202 | 3/1965 | Uhlir | 317—234 |
| 3,200,310 | 8/1965 | Carman | 317—234 |
| 3,243,670 | 3/1966 | Dunster et al. | 317—234 |
| 3,249,829 | 5/1966 | Everett et al. | 317—234 |
| 3,476,987 | 11/1969 | Zido et al. | 317—234 |

JAMES D. KALLAM, Primary Examiner

U.S. Cl. X.R.

317—261